United States Patent [19]
Lamb et al.

[11] Patent Number: 5,920,457
[45] Date of Patent: *Jul. 6, 1999

[54] APPARATUS FOR COOLING ELECTRONIC DEVICES USING A FLEXIBLE COOLANT CONDUIT

[75] Inventors: Charles Robert Lamb, Endwell; Kang-Wah Li, Flushing, both of N.Y.; Elias Papanicolaou, Karlsruhe, Germany; Charles Chaolee Tai, Vestal, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/710,988
[22] Filed: Sep. 25, 1996
[51] Int. Cl.⁶ ........................................................ H05K 7/20
[52] U.S. Cl. ...................... 361/699; 165/104.33; 361/719
[58] Field of Search ........................... 174/16.3; 257/714; 62/259.2; 165/80.3, 80.4, 185, 104.33; 361/699, 701–705, 717–719, 690

[56] References Cited

U.S. PATENT DOCUMENTS

| 4,029,141 | 6/1977 | Ferrari | 165/80.4 |
| 4,558,395 | 12/1985 | Yamada | 361/385 |
| 4,910,642 | 4/1990 | Downing | 361/382 |
| 5,150,274 | 9/1992 | Okada | 361/382 |
| 5,195,020 | 3/1993 | Suzuki | 361/385 |
| 5,413,167 | 5/1995 | Hara | 165/86 |

*Primary Examiner*—Gerald Tolin
*Attorney, Agent, or Firm*—Lily Neff

[57] ABSTRACT

An apparatus for cooling an electronic assembly. The electronic assembly is placed in thermal contact with a single, continuous and monolithic coolant conduit capable of housing a coolant. A plurality of removable cold plates are coupled to the conduit, through their indentation like openings along a peripheral edge of each plate. The conduit with plates is then bent as to complement the contour of the assembly to be cooled in a three dimensional manner as required.

16 Claims, 2 Drawing Sheets

APPARATUS FOR COOLING ELECTRONIC DEVICES USING A FLEXIBLE COOLANT CONDUIT

FIELD OF THE INVENTION

This invention relates to an apparatus and method designed for regulating high interfacial thermal resistance problems in an electronic assembly, and in particular through the use of water as a coolant.

BACKGROUND OF THE INVENTION

The complex design of integrated circuits today contribute to the increased circuit density of the chips utilized. However, as the chip density increases, the thermal properties of the circuit package becomes an important concern. The ability to remove heat generated from the high-powered and highly dense integrated circuits in a semi-conductor packaging becomes vital to the function and performance of the electronics. The initial approach taken to cooling electrical devices through the use of air convection has been replaced by water cooling methods. As the density and integration level of these circuits increases, the amount of heat dissipated by the system can no longer be adequately removed through the use of conventional air convection techniques. Furthermore, the physical size of an effective air convection heat sink is prohibitive, a main concern when using compact devices such as lap-top computers.

Indirect water cooling approach using cold plates quickly has become a selected approach to eliminate the large amount of heat generated by the high power semiconductor modules on large size PC boards or cards. Nonetheless, indirect water cooling approach has not eliminated all heat removal concerns, particularly when a direct or immersion cooling approach is used.

The geometry of the circuit board and its modules have contributed to new concerns, compounding the heat removal problems. Often an array of electronic modules are mounted on a flat printed circuit board. The modules may be of different shapes and geometry and therefore, the height of a particular module can be much higher or lower than that of its neighbors. Due to a large variance of card flatness and module heights, a misalignment of module top surfaces can lead to a complicated set of problems affecting module powers, uneven thermal resistance and even solder failures caused by mechanical stress applied to the joints.

SUMMARY OF THE INVENTION

Accordingly, an object of the present invention is to provide an apparatus and method for cooling electronic devices able to accommodate a variety of geometric constraints.

Another object of the present invention is to provide an apparatus for uniform cooling of electronic modules, accommodating the cooling of all components regardless of their location on an integrated circuit board and taking into account the misalignment of chip surfaces.

Yet another object of the present invention is to provide an apparatus and method for cooling of electronic devices with an improved thermal performance and reliability feature.

A further object of the present invention is to provide a low cost alternative to electronic cooling devices.

To achieve the above-mentioned objects, and other related ones a method and apparatus for cooling of an electronic assembly is suggested. The electronic assembly is placed in thermal contact with a non-jointed flexible coolant conduit housing a coolant. A plurality of cold plates are then slipped around the conduit, through their indentation like openings provided along a peripheral edge of each plate. This conduit and plate arrangement is then placed in thermal contact with the electronic assembly to be cooled. To provide for contour requirements of the assembly, including the module height and flatness, the conduit is then bent along X, Y or Z axis selectively to accommodate a tight fit.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in conjunction with the accompanying drawings in which:

DETAILED DESCRIPTION OF THE INVENTION

Figure 1:
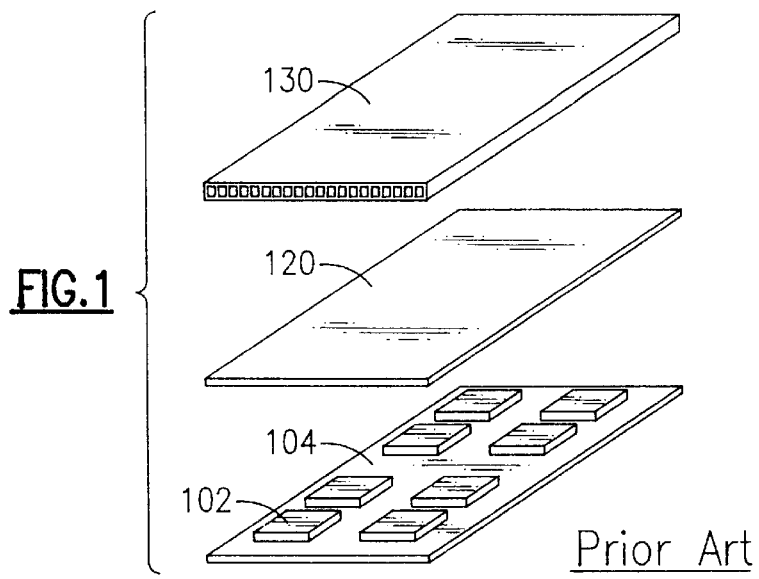
FIG. 1 is a typical cold-plate cooling system design such as the one used in prior art.

FIG. 1 shows a typical cold-plate cooling system design such as the one used in the prior art. In this traditional design or other similar indirect water cooling systems, the approach taken is to cool all semiconductor modules, as shown at 102, on a board or card, as shown at 104, using a one-piece rigid common cold plate, as shown at 130, to exchange heat with modules through conduction. However, the variation in module height differences and geometry as well as card warpage, causes a misalignment of the module surfaces interfering with the cold plate making a good contact with all the modules.

The misalignment of module top surfaces can be quite significant, due to variance of card flatness and module heights. Several experiments were conducted showing that a sample 8×12 inch memory card had a maximum warpage of 42 mils before card assembly and wave solder. In another study an estimated maximum module top surface misalignment of +/−14 mils was calculated. These would result in a maximum module top surface misalignment of +/−56 mils.

To provide good contact between the cold plate and the modules, a compressible interface material, as shown at 120, had been used to fill up the gaps in an effort to form a good conduction heat path. However, in instances when the misalignment is significant, (such as in the above-mentioned example) the interface material needed had to be very compressible and thick, often thicker than 100 mils. This compressibility and thickness requirement often limits the choice of interface material to be used to elastomers in sponge form which unfortunately only provide moderate thermal conductivity. Furon Silicon Rubber Sponge is such a material with a mere 0.5 watt/(deg K-meter) at 5 psi and 2.7 w/K-m, even with a pressure of under 34 psi and only at a 50% compression capacity. The thermal resistance of an 1 inch square and $\frac{1}{16}$ inch thick Furon R-10404 foam was measured at 10 deg C./w and 5 psig pressure. For a 32 mm SBC (Single Board Computer) dissipating 17.5 watts, this would result in an 110 deg C. temperature rise across the interface alone. Yet, to meet the compression requirement of a +/−56 mil surface misalignment, such as the one stated in the example earlier, a much thicker interface material will be needed, resulting in an even higher interface thermal resistance and/or temperature rise. Furthermore, in order to force the SBC top surfaces to make contact with the cold-plate at a needed 34 psi pressure, a large mechanical force must be applied to the printed card. As a result, the solder joints of modules on the card will be highly stressed which would largely increase the probability of future solder failures.

Figure 2:
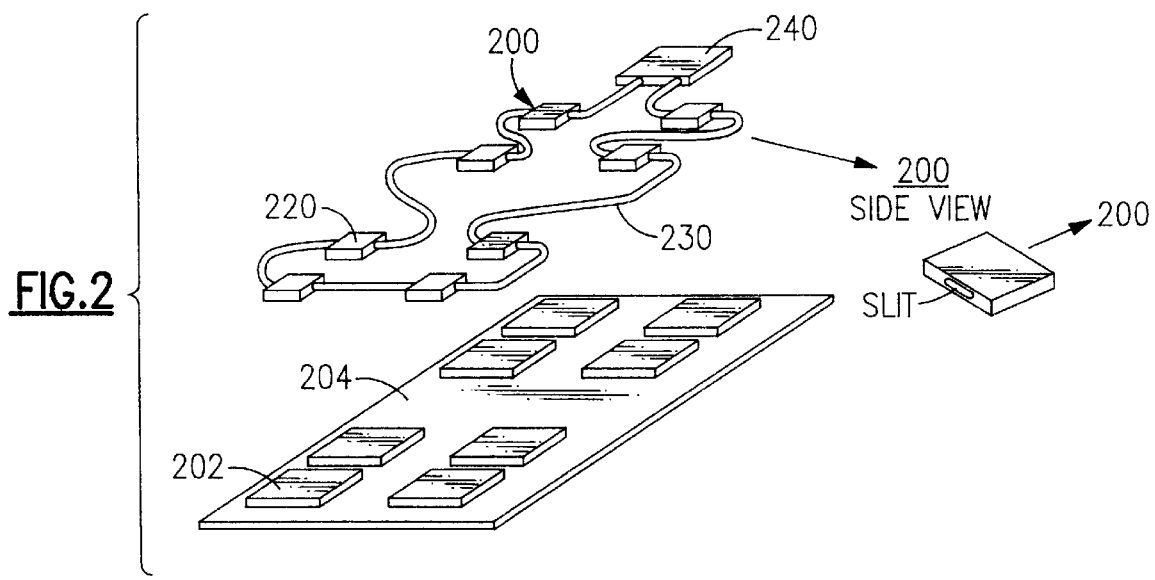
FIG. 2 is an illustration of one embodiment of the present invention.
Figure 3:
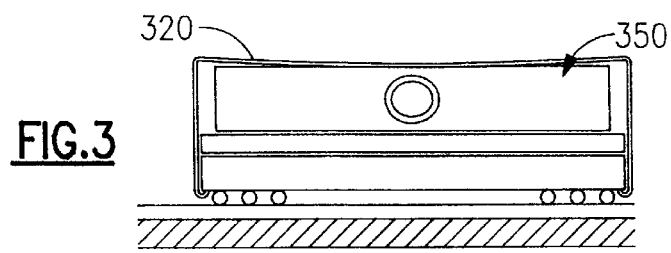
FIG. 3 is an illustration of a clamping mechanism such as the one used in one embodiment of the present invention.

The problems associated with prior art are resolved in the present disclosure. FIG. 2 is an illustration of one embodiment of the present invention. As shown in FIG. 2, a flexible, monolithic, non-jointed coolant conduit is provided as shown at 230. A plurality of cold plates, as shown at 220, are connected to this conduit. The plates can be used specifically to provide concentrated cooling in selective areas, such as in component areas of the device, while the conduit will provide more uniform cooling to the device as a whole. For example, when the electronic device is an electronic assembly that houses a plurality of modules, the plates can be directly placed on the modules, and even further secured to provide the desired cooling effect to those areas. One embodiment of the present invention as shown in FIG. 3, provides for a clamping mechanism used for securing the plates to the modules for such improved cooling. A spring clamps as shown at 320 is provided in this particular embodiment, however, other fastening mechanisms can be equally used.

The flexible conduit is able to house a coolant, independently or by being connected to a coolant supply. In either case, the conduit can serve as a coolant supply to the plates and as a cooling element for the electronic device. In some circumstances, depending on the overall cooling effect desired and the thermal conductivity of the plate material used, it may sufficient to cool the plates just by placing them in contact with the cooled conduit. In other circumstances, however, where a greater overall cooling effect is desired, the plates can be designed as to have an internal chamber or even to be hollow centered as to house a coolant. The coolant can be supplied to the plates either independently or via the conduit. When the coolant is provided independently, the coolant is usually provided in the plates and then the plates are sealed as to provide a closed and leakage proof environment. When the coolant is to be provided via the conduit, in one embodiment, corresponding apertures are provided in the plate-chamber arrangement as well as in the conduit so that when these apertures are lined up, the coolant flows freely from the conduit into the plate-chamber, as shown in FIG. 3 at 350 (and vice versa if needed). The conduit and plates arrangement is then sealed around the area of these apertures as to guard against coolant leakage.

In a preferred embodiment of the present invention, the cold plates are made of copper and the conduit is either copper or aluminum. The coolant of choice is water and the conduit itself has a serpentine pattern. The serpentine feature of the design also provides thermal stress relief.

The shape of the cold plates and the method of attaching them to the conduit can be varied. In one embodiment of the present invention, each plate is provided a hole selectively located and used for passing or pulling of the conduit through it. The holes (generally shown at 200) have to be sized, however, as not to constrict the flow of coolant once the conduit is passed or pulled through them. In a preferred embodiment of this design, the rigid one piece large common cold plate of the original design is replaced by eight small cooling blocks. In this embodiment each of these blocks are clipped on the top surfaces of the modules independently with a spring clip again as shown in FIG. 3. The cooling blocks are then connected with a 3/16 inch O.D. soft copper tube.

In an alternate embodiment, an indentation like opening, (generally shown at 200) in some embodiments resembling a slit, is provided along a peripheral edge of each plate to allow the plates to slip around the conduit. Again, the openings have to be sized so as not to constrict coolant flow. In a preferred embodiment of this design, the indentation like openings are U shaped channels provided in top of the plates in order to lay the conduit in them.

In either design, solder or alternate attachment methods can then be used to fix the conduit more securely to the plates, before or after putting the plate-conduit arrangement in thermal communication with the device and the components to be cooled.

In one embodiment of the present invention, it is possible to secure the two ends of the conduit to one another. In an variation of this embodiment, the conduit is twisted into a serpentine design before the ends are secured to one another. In either case it is obviously that if the plate designs are such that the conduit has to be pulled through the plates, the securing of the conduit ends has to be accomplished after the conduit is pulled through the plates holes. However, when in the alternate design where the plates can be slipped around the conduit, the conduit ends can be secured at any time either before or after the plates are slipped around the conduit. In this latter instance it is even possible for the conduit ends to be secured once the conduit has been already put in thermal contact with the device to be cooled, so as to provide more conformity with the contour requirements of the device.

If the ends of the conduit are to be secured to one another, however, means has to be provided for coolant placement in the conduit. For example, it may be possible to provide a coolant prior to securing the ends. In this case the ends are also sealed as to prohibit fluid leakage so that a closed environment is formed inside the conduit housing the coolant. In the alternative if an auxiliary coolant supply source is being used, a valve or similar such devices can be used for connecting the conduit to the supply source. The valve would also regulate coolant flow, the amount of coolant provided and control coolant ingress/egress. In yet another alternative embodiment, the ends can be secured to one another via a connector. It is important that the connector be of such size and configuration as not to constrict the flow of the coolants. The connector can either provide a closed internal coolant environment, or be used in conjunction with a valve. It is also possible for the connector to act independently as a coolant regulator, providing both access to an auxiliary coolant supply source and also controlling the flow and ingress/egress of the coolant into (and out of) the conduit if a valve is not provided. A connector is shown in FIG. 2 at 240.

One of the advantages of the flexible cold-plate design of the present invention is its ability to conform to the contour requirements of any electronic device, such as the electronic assembly and modules of FIG. 2. The design of flexible cold-plate arrangement of FIG. 2 is completely complimentary and conformal to the modules top surfaces shown at 202. The flexibility of the conduit will allow a 3-dimensional freedom of movement of plates and the conduit X-Y plane which will make the cooling self-adjustable to the X-Y locations of the modules or other components. In this way the conduit and cold plates can adjust their height to match the misalignment of each individual modules or component. Due to this 3-dimensional flexibility, no precision of X-Y-Z dimensional location is needed. Furthermore, with this freedom of movement and a positive securing mechanism such as the clamping mechanism of FIG. 3, the cold plates are pressed tightly onto the top surfaces of each module. Hence the requirement of a thick flexible interface material and its relatively high thermal resistance is eliminated.

Test data showed that even without any interfacial material (i.e. dry contact), such as the clipped-on contact mechanism of FIG. 3, the result would yield a low interfacial thermal resistance of 0.5 deg C./W nominal and 1.0 deg C./W in worst case. In a preferred embodiment of the present invention, an interfacial thermal layer is also provided between the component, i.e. module, to be cooled and the cold plates. This interface layer will further enhance the cooling abilities of the conduit-plate arrangement without any adverse effects. For example when the interface applied is a 2 mil thick of thermal grease, the interfacial thermal resistance will be reduced to a negligible 0.045 deg C./W. Hence, the present flexible cold-plate design not only would result to a 153 deg C. chip temperature reduction at worst case and 82 deg C. at nominal case but also would relax the severe mechanical stress on the solder joints as it would be resulted by a rigid cold-plate design.

Figure 4:
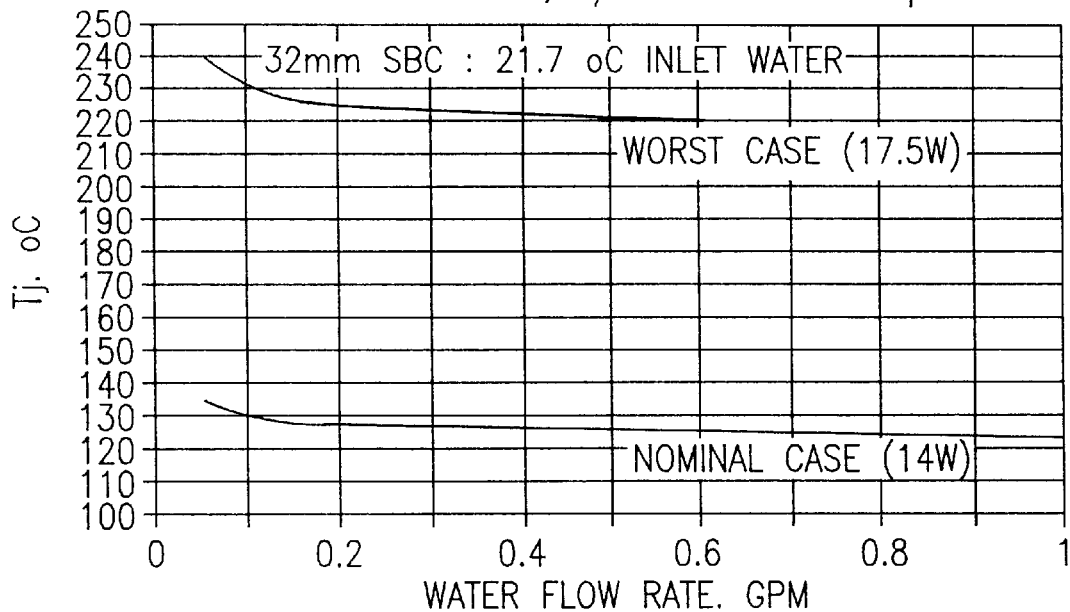
FIGS. 4 and 5 show the calculated worst-case chip temperatures for both the conventional rigid cold plate design and the flexible cold plate design respectively.
Figure 5:
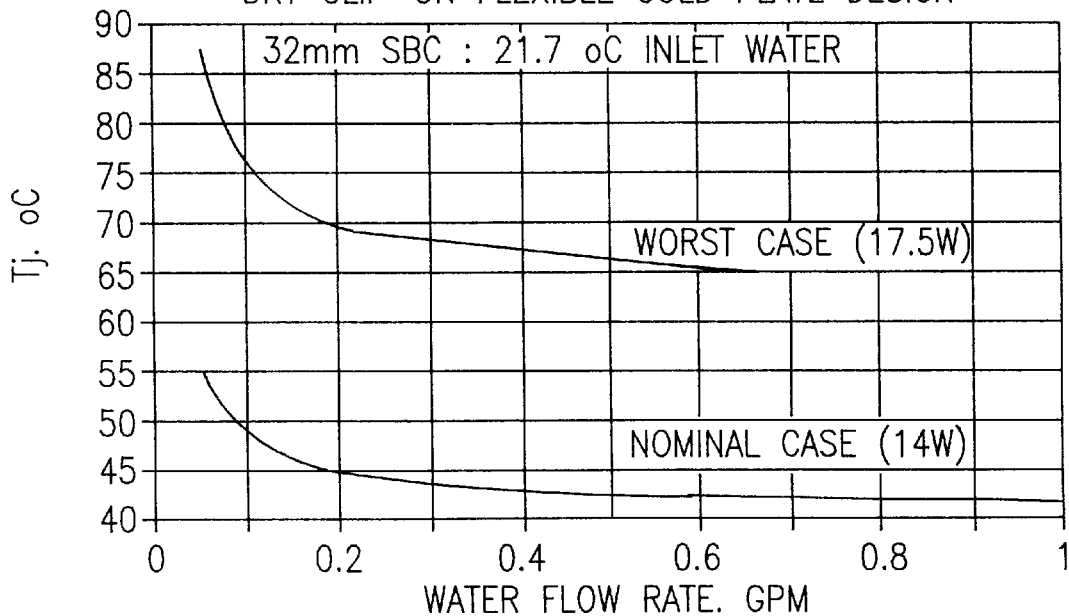

To demonstrate the thermal advantages of the present design the empirical interfacial thermal resistance data and convection thermal resistance data is used to calculate the Tj's of modules on a certain memory card. FIGS. 4 and 5 show this same comparison data on a graph for the calculated worst-case chip temperatures of the same memory card for both the conventional rigid cold plate design and the flexible cold plate design respectively. The following graph is a brief comparison of the calculated thermal resistance and Tj at worst-case situation based on these verified data for 0.25 gpm water flow rate.

|  | RIGID COLD-PLATE .0625" | FLEX. COLD-PLATE | |
| --- | --- | --- | --- |
| INTERFACE MATERIAL | Furon R10404 | Dry | Th. Grease |
| WC Water Temp (C.) | 25.4 | 25.4 | 25.4 |
| Chip Power (watts) | 17.4 | 17.4 | 17.4 |
| Rint (given - C/W) | 1.18 | 1.18 | 1.18 |
| Water-to-Cold Plate Resistance | 0.03 | 0.09 | 0.09 |
| Cold Plate to SBC Interface resistance *1 | 9.9 | 1.0 | 0.07 |
| Resulting Chip TJ | 222 deg C. | 69 | 51 |

Note *1 - Worst than normal values are used due to variations in contact surface condition and pressure.

In addition to thermal advantages, the 3-dimensional freedom of movement of each individual cold plate provides substantial advantage in cost reduction because no precision positioning nor machining is needed in the manufacture of the flexible cold plate design of the present invention. Furthermore, due to a simplified design the reliability of the cooling system would also be improved.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An apparatus cooling an electronic assembly having a plurality of electronic modules, said apparatus comprising:

a single and continuous, thermally conductive coolant conduit housing a coolant;

said coolant conduit being flexible so that it can be selectively bent in any or all three x-y or z axis dimensions as to conform to contour requirements of said electronic assembly;

a plurality of cold plate each coupled to said conduit through an indentation opening present along at least one peripheral edge of said plates each said slit receiving said conduit, each cold plate thermally connected to a respective electronic module.

2. The apparatus of claim 1, wherein said indentation slits are of such size as not to constrict coolant flow in said conduit.

3. The apparatus of claim 1, wherein each of said cold plates are hollowed to house a coolant; and each of said plates are sealed along all edges, in particular along edges bordering on said indentation slit, as to avoid coolant leakage.

4. The apparatus of claim 1, further comprising a chamber in each plate for housing a coolant.

5. The apparatus of claim 4, wherein a coolant is provided independently in each of said plate chambers; sealing means provided along all edges of said chamber, especially along any peripheral edges bordering on said indentation opening, as to prevent coolant leakage and thus creating a closed plate chamber environment.

6. The apparatus of claim 1, further comprising connecting means for securing said plates to said modules as to provide better concentrated cooling for said modules.

7. The apparatus of claim 6, wherein said modules are secured to said plates by means of a clamping mechanism.

8. The apparatus of claim 7, wherein said clamping mechanism further comprises a spring clip.

9. The apparatus of claim 6, further comprising a thin layer of thermal interface placed between said modules and said plates.

10. The apparatus of claim 6, further comprising applying a thin layer of thermal grease between said modules and said plates.

11. The apparatus of claim 1, wherein said cooling conduit is monolithic and serpentine in shape.

12. The apparatus of claim 1, wherein said coolant conduit and said plates are made of copper.

13. The apparatus of claim 12, wherein said coolant conduit is made of aluminum.

14. The apparatus of claim 1, wherein said coolant in said plates and said conduit is water.

15. The apparatus of claim 1, wherein said cooling conduit has two ends and said two ends of said conduit are fastened to one another by a connector that allows for coolant flow and controls coolant quantity in said conduit.

16. The apparatus of claim 15, wherein said conduit is twisted into a serpentine shape before said two ends are fastened.

* * * * *